United States Patent
Yamamoto

(10) Patent No.: US 6,760,213 B2
(45) Date of Patent: Jul. 6, 2004

(54) ELECTROSTATIC CHUCK AND METHOD OF TREATING SUBSTRATE USING ELECTROSTATIC CHUCK

(75) Inventor: Kouichi Yamamoto, Yamaguchi (JP)

(73) Assignee: Hitachi High-Technologies Corporation, Tokyo (JP)

(*) Notice: Subject to any disclaimer, the term of this patent is extended or adjusted under 35 U.S.C. 154(b) by 0 days.

(21) Appl. No.: 10/216,777

(22) Filed: Aug. 13, 2002

(65) Prior Publication Data

US 2003/0165044 A1 Sep. 4, 2003

(30) Foreign Application Priority Data

Mar. 4, 2002 (JP) .......................................... 2002-057357

(51) Int. Cl.[7] .................................................. H01T 23/00
(52) U.S. Cl. ........................................ 361/230; 361/234
(58) Field of Search ................................. 361/230, 231, 361/232, 233, 234, 235

(56) References Cited

U.S. PATENT DOCUMENTS

| | | | | |
|---|---|---|---|---|
| 5,179,498 A | * | 1/1993 | Hongoh et al. | 361/234 |
| 5,322,590 A | * | 6/1994 | Koshimizu | 438/9 |
| 5,897,753 A | * | 4/1999 | Schatz et al. | 204/192.12 |
| 5,958,258 A | * | 9/1999 | Ishihara et al. | 216/60 |
| 6,362,946 B1 | * | 3/2002 | Larsen | 361/234 |

* cited by examiner

Primary Examiner—Brian Sircus
Assistant Examiner—Danny Nguyen
(74) Attorney, Agent, or Firm—Antonelli, Terry, Stout & Kraus, LLP

(57) ABSTRACT

An electrostatic chuck comprises a sample stage 9 provided with electrodes 1, 2 and 3 for applying n-phase alternating voltage wherein n is equal to or greater than 2, and a circuit for applying the n-phase alternating voltage. The present electrostatic chuck realizes smooth and speedy attraction/separation of the substrate without the need for a charge elimination process, and the present chuck solves the problem of substrate vibration.

6 Claims, 9 Drawing Sheets

ELECTROSTATIC CHUCK AND METHOD OF TREATING SUBSTRATE USING ELECTROSTATIC CHUCK

FIELD OF THE INVENTION

The present invention relates to an electrostatic chuck for attracting and holding substrates such as semiconductor wafers, and especially relates to an electrostatic chuck that realizes quick attraction and separation of the substrate (wafer) without causing wafer vibration.

DESCRIPTION OF THE RELATED ART

Heretofore, an apparatus that attracts and holds a wafer using electrostatic force, so-called an electrostatic chuck, is utilized to hold substrates such as semiconductor wafers in a semiconductor fabrication system and the like. There are two types of electrostatic chucks. One is a so-called monopole-type electrostatic chuck comprising a single electrode, wherein a certain amount of voltage as opposed to ground potential is applied to the electrode while the substrate is grounded through plasma etc., thus utilizing the electrostatic force generated between the wafer and the electrode. Another is a so-called dipole-type electrostatic chuck comprising either a pair of or plural pairs of electrodes, wherein voltage is applied between the electrodes by which reverse polarity charge is induced in the substrate, thus utilizing the electrostatic force generated between the substrate and the electrodes.

The voltage applied to the above-mentioned single electrode or a pair of (pairs of) electrodes can either be DC voltage or single-phase alternating voltage.

The prior art technology related to these types of electrostatic chucks are disclosed for example in Japanese Patent Laid-Open Provisional Publication Nos. 7-273177 (273177/95) 9–213780 (213780/97) and 6-244271 (244271/94).

However, the conventional electrostatic chucks have the following problems. First, according to the system where DC voltage is applied to the electrode(s), electric charge is accumulated in the back surface of the substrate while the wafer is being attracted in both the monopole type and dipole type apparatuses, and the accumulated charge makes the separation of the substrate difficult. Especially in a plasma processing unit and the like where the substrate is in contact with plasma, the substrate becomes negatively charged as opposed to the ground potential through plasma, so the amount of accumulated charge is varied according to the state of plasma, and thus the process of charge being accumulated in the back surface of the substrate becomes more complex. For example, Japanese Patent Laid-Open Provisional Publication Nos. 7-273177 and 9-213780 disclose a method of removing the charge being accumulated in the substrate by applying a reverse voltage so-called a charge eliminator thereto. However, this charge elimination process required in the conventional techniques deteriorates the throughput of the apparatus.

In comparison thereto, Japanese Patent Laid-Open Provisional Publication No. 6-244271 discloses a method of applying a single-phase alternating voltage according to which no electric charge is accumulated in the back surface of the substrate, so there is no need to perform the charge elimination process when separating the substrate. However, this prior art method has a drawback in that attraction force becomes zero when the voltage reaches zero, and as a result, the wafer starts to vibrate.

SUMMARY OF THE INVENTION

The object of the present invention is to provide an electrostatic chuck that does not require a charge elimination process when separating the substrate, which has been required in the conventional art where DC voltage is applied, and a method of treating a substrate using this electrostatic chuck. The present electrostatic chuck solves the problem of substrate vibration, which had been observed in the conventional apparatuses utilizing single-phase alternating voltage.

In order to solve the problems of the prior art, the present invention provides an electrostatic chuck characterized in applying an n-phase alternating voltage, wherein n is a number equal to or greater than 2. FIG. 1 illustrates a basic structure of the present invention, in which three-phase alternating voltage is applied (n=3). A substrate 5 is mounted on a sample stage 9 comprising an R-phase electrode 1, an S-phase electrode 2, a T-phase electrode 3 and an insulator 4, having a three-phase alternator 6 connected to the electrodes 1, 2 and 3 via switch 11. By switching the switch 11 on and off, the wafer 5 can be attracted to or separated from the stage.

The time variation of voltage applied between the substrate 5 and the R-phase electrode 1, S-phase electrode 2 and T-phase electrode 3 is shown in FIG. 3. Moreover, the time variation of attraction force provided between the wafer 5 and sample stage 9 is illustrated in FIG. 4. As can be seen from FIG. 4, the attraction force provided between the wafer 5 and sample stage 9 is not varied by time, and as a result, the wafer will not vibrate.

Moreover, since no DC component is included in the voltage applied to electrodes 1, 2 and 3, no charge is accumulated in the back surface of the wafer, which had caused problems when DC voltage was applied to the electrodes. Furthermore, even in a plasma processing equipment and the like where the substrate comes into contact with plasma and the substrate takes a negative potential as opposed to ground potential, by insulating the primary side and the secondary side of the three-phase alternator 6 and by maintaining the secondary side providing three-phase alternating voltage to the electrodes 1, 2 and 3 to a floating potential as opposed to ground potential, no DC voltage is generated between the wafer 5 and electrodes 1, 2 and 3, and thus no charge accumulates in the back surface of the substrate. According to the present invention, prompt attraction and separation of the wafer is realized simply by switching the switch 11 on and off, without having to perform a charge elimination process.

In other words, by utilizing three-phase alternating voltage, the present invention provides an electrostatic chuck that realizes smooth and secure attraction and separation of the substrate, that does not require a charge elimination process and that solves the problem of substrate vibration.

Such advantages of the present invention can also be enjoyed by applying an n-phase alternating voltage wherein n equals 4 or more. FIG. 2 illustrates the basic structure of the present invention in which a four-phase alternating voltage is applied (n=4).

Furthermore, the above advantages can be enjoyed by applying a two-phase alternating voltage (n=2). FIG. 15 illustrates the basic structure of the present invention in which a two-phase alternating voltage is applied (n=2). FIG. 16 illustrates the time variation of the R-phase voltage and S-phase voltage of a two-phase alternator 19. The phases of the R-phase voltage and S-phase voltage are varied by 90 degrees so that the attraction force applied to the substrate 5 and the sample stage 9 does not fall to zero, and as a result, the substrate will not vibrate.

DETAILED DESCRIPTION OF THE PREFERRED EMBODIMENT

Figure 1:
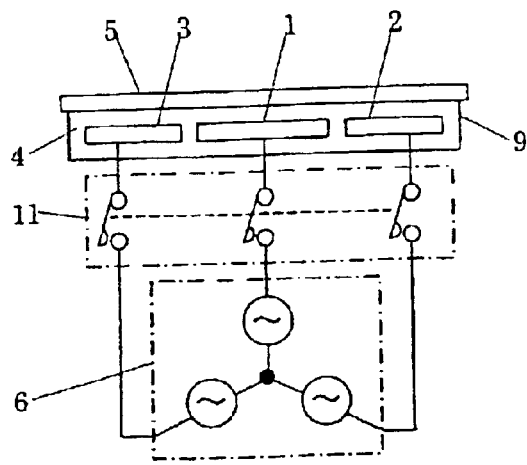
FIG. 1 illustrates the basic structure of the electrostatic chuck according to the present invention in which a three-phase alternating voltage is applied (n=3)
Figure 2:
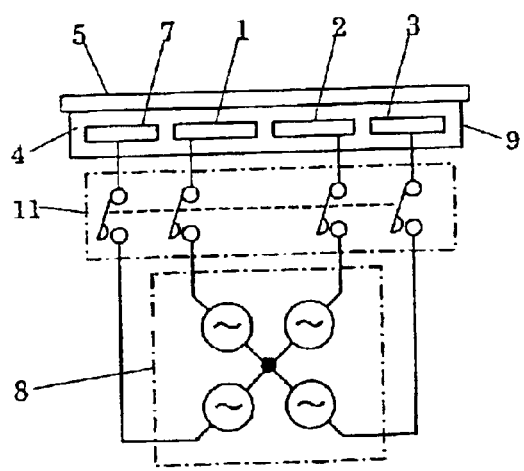
FIG. 2 illustrates the basic structure of the electrostatic chuck according to the present invention in which a four-phase alternating voltage is applied (n=4)
Figure 3:
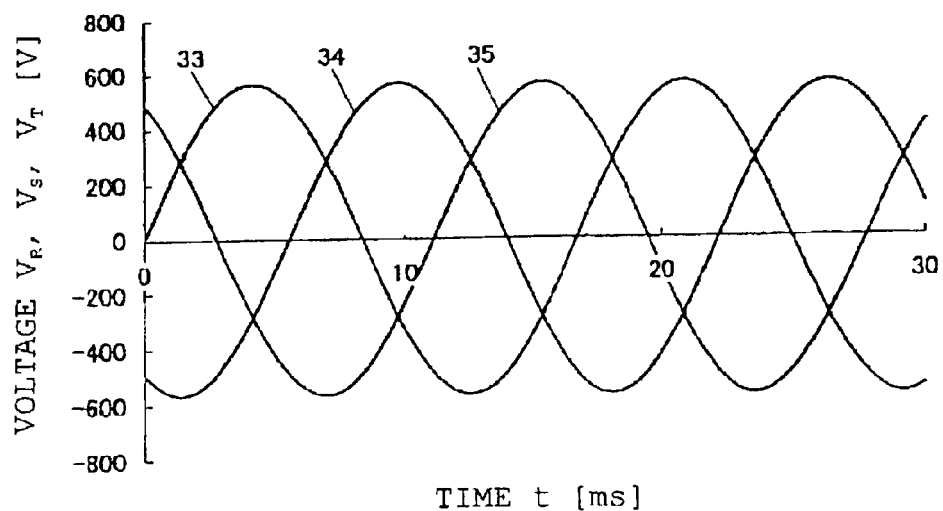
FIG. 3 illustrates the time variation of voltage applied between electrodes 1, 2 and 3 and wafer 5 when three-phase alternating voltage is applied to the electrostatic chuck of the present invention (n=3)
Figure 4:
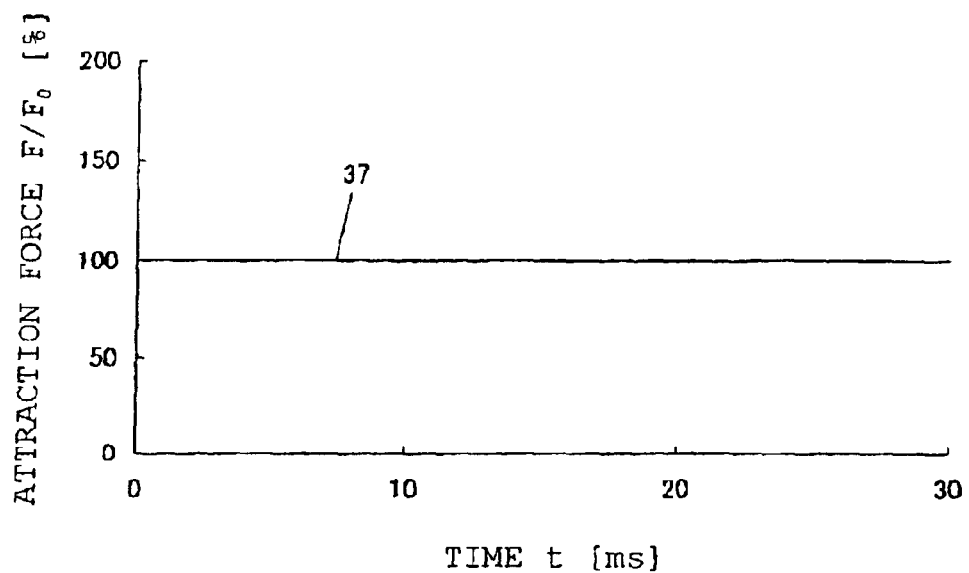
FIG. 4 illustrates the time variation of attraction force generated between the wafer 5 and sample stage 9 when three-phase alternating voltage is applied to the electrostatic chuck of the present invention (n=3)
Figure 5:
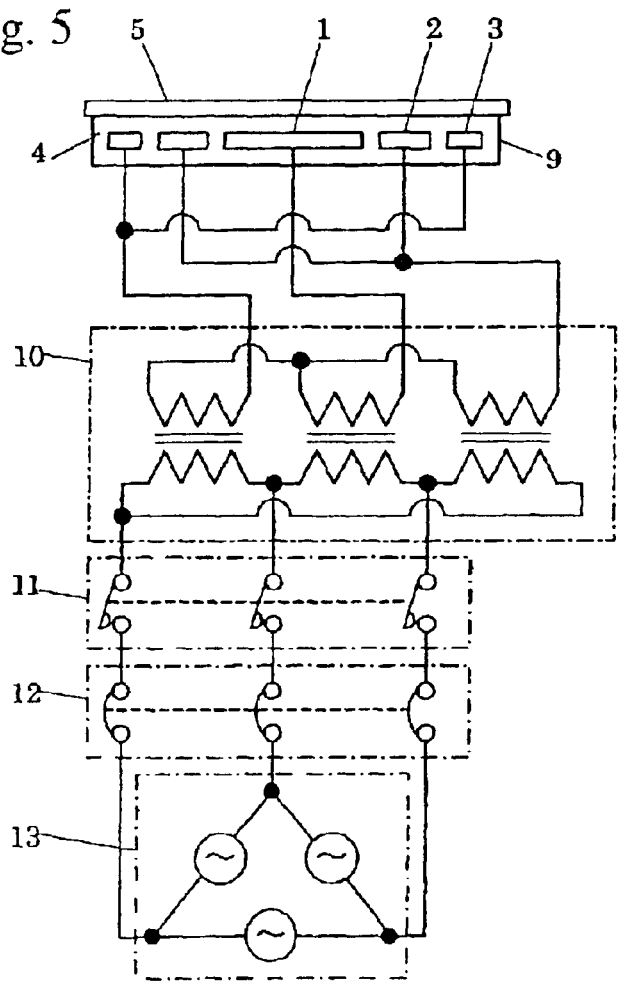
FIG. 5 illustrates one embodiment of the present electrostatic chuck in which three-phase alternating voltage is applied (n=3)

One preferred embodiment of the electrostatic chuck according to the present invention is illustrated in FIG. 5, in which a three-phase alternating voltage is applied to the chuck (n=3). The substrate 5 is mounted on a sample stage 9 composed of an R-phase electrode 1, an S-phase electrode 2, a T-phase electrode 3 and an insulating body 4. FIG. 5 illustrates the case where the electrodes 1, 2 and 3 are covered by the insulating body 4 on the mounting surface of wafer 5, but if the substrate 5 is a liquid crystal substrate and the like whose back surface is covered with an insulator, the electrodes 1, 2 and 3 can be exposed on the mounting surface. The voltage applied to the electrodes 1, 2 and 3 and the frequency thereof are appropriately selected according to the material of the insulator, the material of the wafer, and so on. In the example of FIG. 5, the effective value of the voltage applied to electrodes 1, 2 and 3 is 400 V, and the frequency is either 50 Hz or 60 Hz. A commercial three-phase alternator 13 is connected to the R-phase electrode 1, S-phase electrode 2 and T-phase electrode 3 via a transformer 10, a switch 11 and an overcurrent protector 12. In the example of FIG. 5, a delta-Y connection transformer 10 is utilized, but a delta—delta connection, a Y-delta connection, or a Y—Y connection transformer can also be used. The winding ratio of the transformer 10 is set to 1:2 so that the effective value of the secondary side phase voltage becomes 400 V. If the voltage applied to the electrodes is varied or if the connection of the transformer 10 differs, the winding ratio must be changed so as to correspond thereto. The frequency of the alternating voltage being applied is either 50 Hz or 60 Hz, which are provided as commercial power. The primary side of the transformer 10 is insulated from the secondary side thereof, and even if the substrate 5 within a plasma processing equipment and the like takes a negative potential in comparison to the ground potential through plasma, no DC voltage is generated between the wafer 5 and the electrodes 1, 2 and 3, and thus no charge is accumulated in the wafer. By switching the switch 11 on and off, the wafer can be attracted to and separated from the sample stage.

Figure 6:
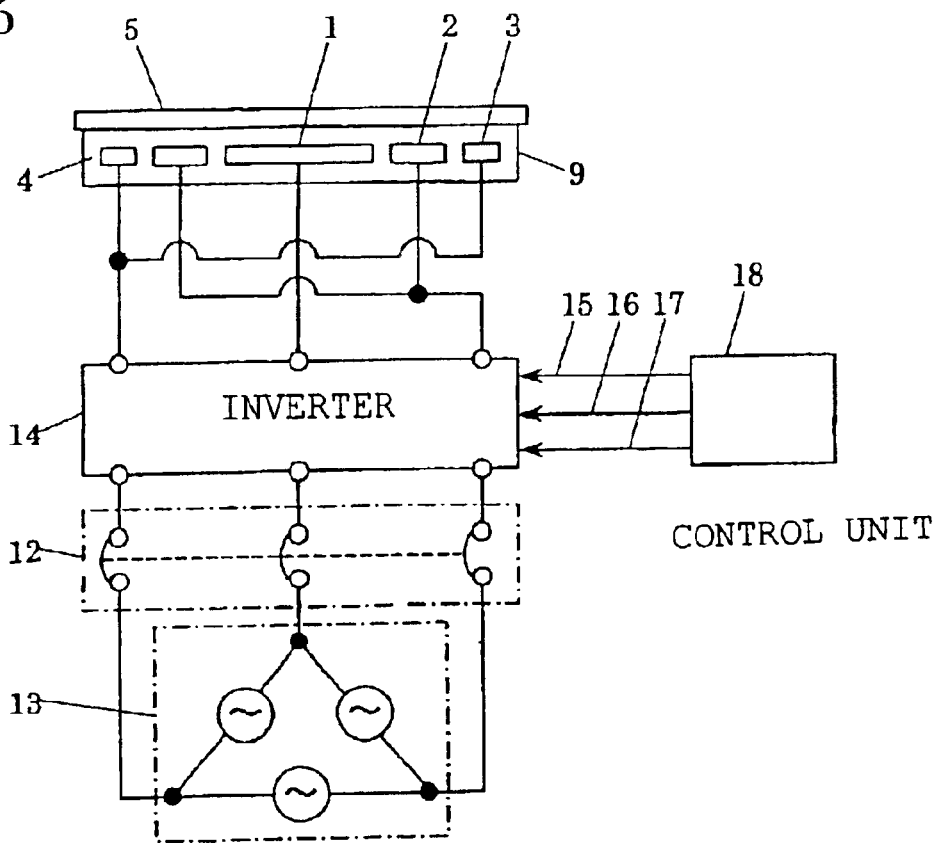
FIG. 6 illustrates another embodiment of the present electrostatic chuck in which three-phase alternating voltage is applied (n=3).

FIG. 6 is a drawing showing another preferred embodiment of the electrostatic chuck according to the present invention in which three-phase alternating voltage is applied (n=3). The wafer is attracted to and separated from the stage according to the on/off of the output command 15 to an inverter 14. By varying the value of the voltage command 16 and the frequency command 17 transmitted from a controller 18 to the inverter 14, the three-phase alternating voltage and the frequency applied between the electrodes 1, 2 and 3 and the wafer 5 can be changed easily.

Figure 7:
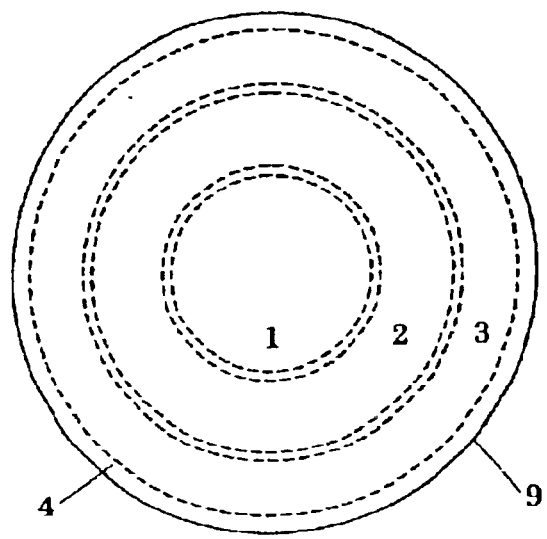
FIG. 7 is a plan view illustrating one embodiment of the sample stage 9 of the electrostatic chuck according to the present invention in which three-phase alternating voltage is applied (n=3)

FIG. 7 is a plan view illustrating one embodiment of the sample stage 9 of the present electrostatic chuck in which a three-phase alternating voltage is applied (n=3). The ratio of areas of R-phase electrode 1, S-phase electrode 2 and T-phase electrode 3 is set to 1.

Figure 8:
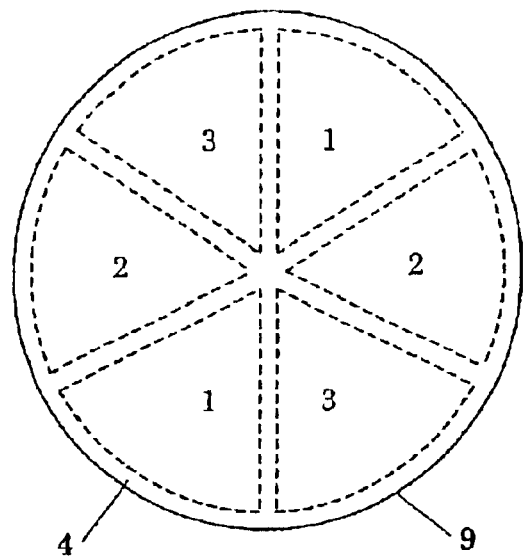
FIG. 8 is a plan view illustrating another embodiment of the sample stage 9 of the electrostatic chuck according to the present invention in which three-phase alternating voltage is applied (n=3)
Figure 9:
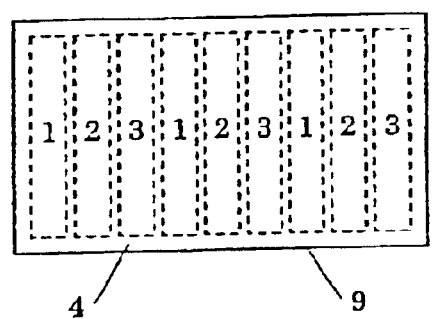
FIG. 9 is a plan view illustrating yet another embodiment of the sample stage 9 of the electrostatic chuck according to the present invention in which three-phase alternating voltage is applied (n=3)
Figure 10:
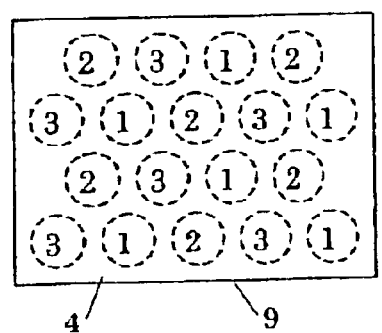
FIG. 10 is a plan view showing yet another embodiment of the sample stage 9 of the electrostatic chuck according to the present invention in which three-phase alternating voltage is applied (n=3)

FIGS. 8, 9 and 10 are plan views illustrating other embodiments of the sample stage 9 of the electrostatic chuck according to the present invention in which three-phase alternating voltage is applied (n=3). The ratio of areas of R-phase electrode 1, S-phase electrode 2 and T-phase electrode 3 is set to 1.

Figure 11:
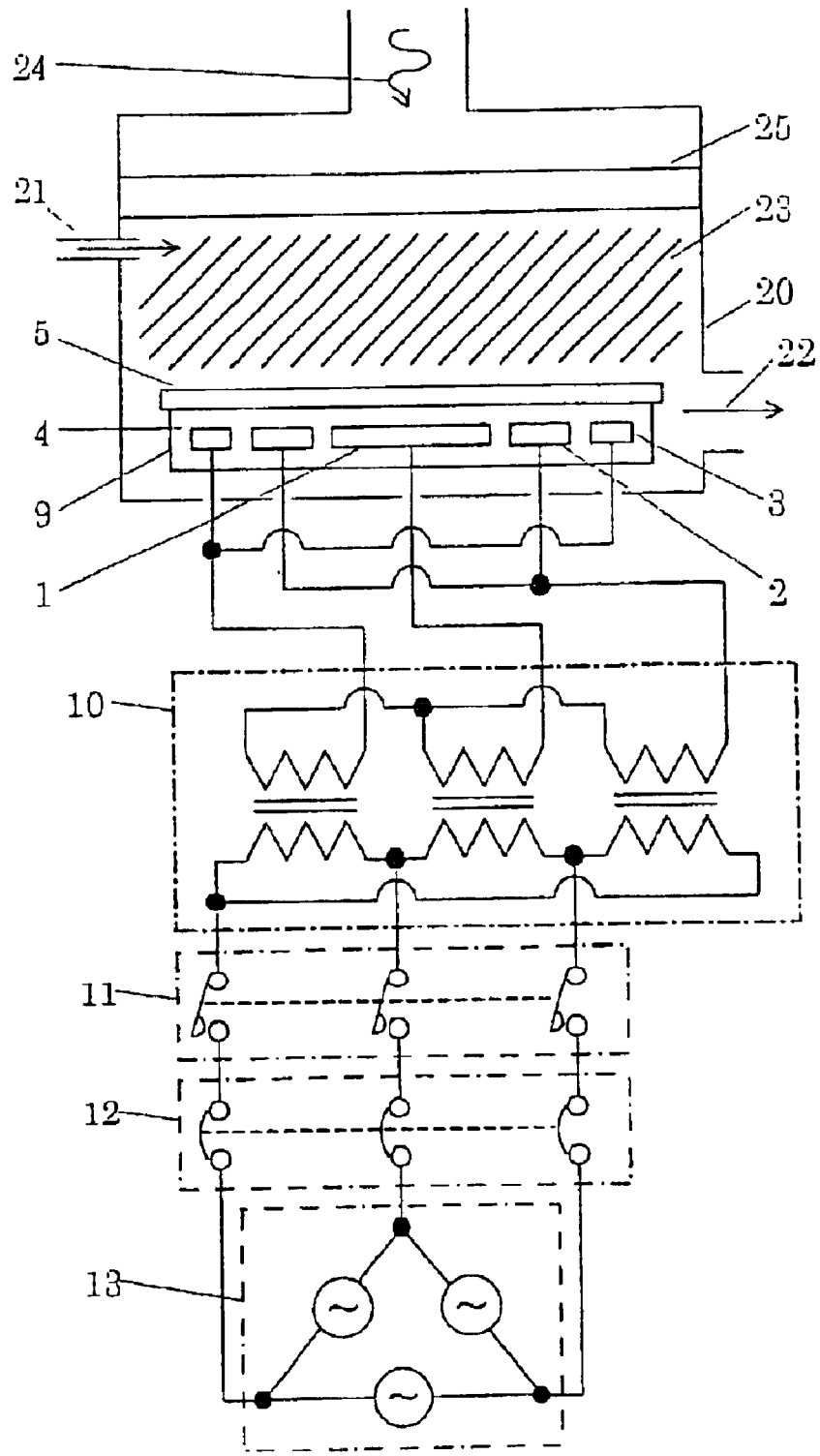
FIG. 11 illustrates one embodiment of a processing equipment for a substrate utilizing the electric chuck of the present invention.
Figure 13:
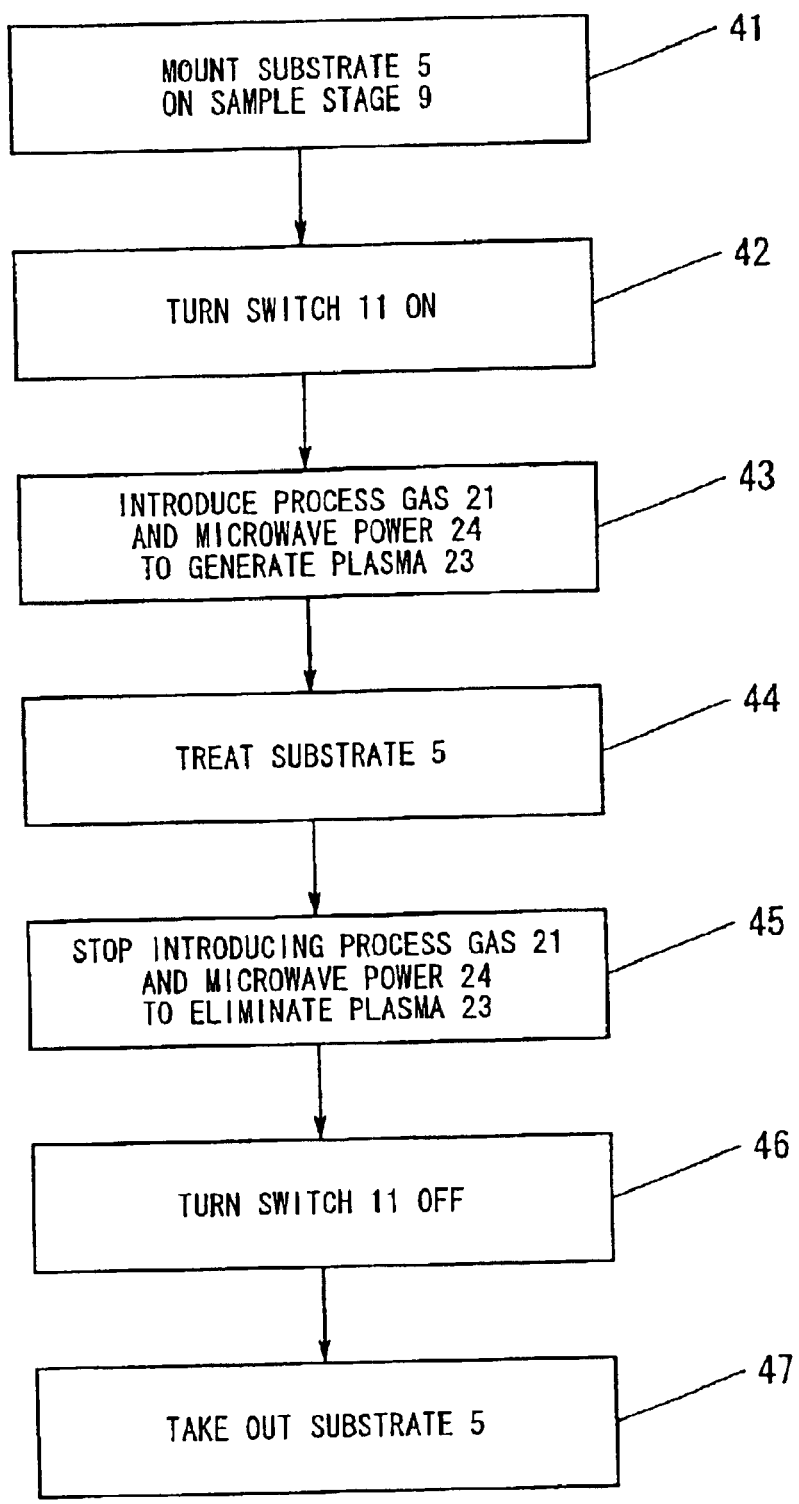
FIG. 13 is a flowchart showing one embodiment of the method for processing a substrate using the electric chuck according to the present invention.

FIGS. 11 and 13 illustrate one embodiment of the method for treating a substrate utilizing the electrostatic chuck according to the present invention. FIG. 11 is a drawing showing the substrate processing equipment according to the present embodiment. In FIG. 11, the sample stage 9 is disposed within a vacuum chamber 20, and the substrate 5 is mounted on the sample stage 9. Process gas 21 and microwave power 24 are introduced to the vacuum chamber so as to create plasma 23. FIG. 13 is a flowchart showing the method of processing the substrate according to the present embodiment. In step 41, the substrate 5 is mounted on the sample stage 9, and thereafter in step 42, the substrate 5 is attracted to the sample stage 9. After the substrate is treated in step 44, the procedure advances to step 46 where the substrate 5 is separated from the stage 9, and in step 47 the substrate 5 is taken out.

Figure 12:
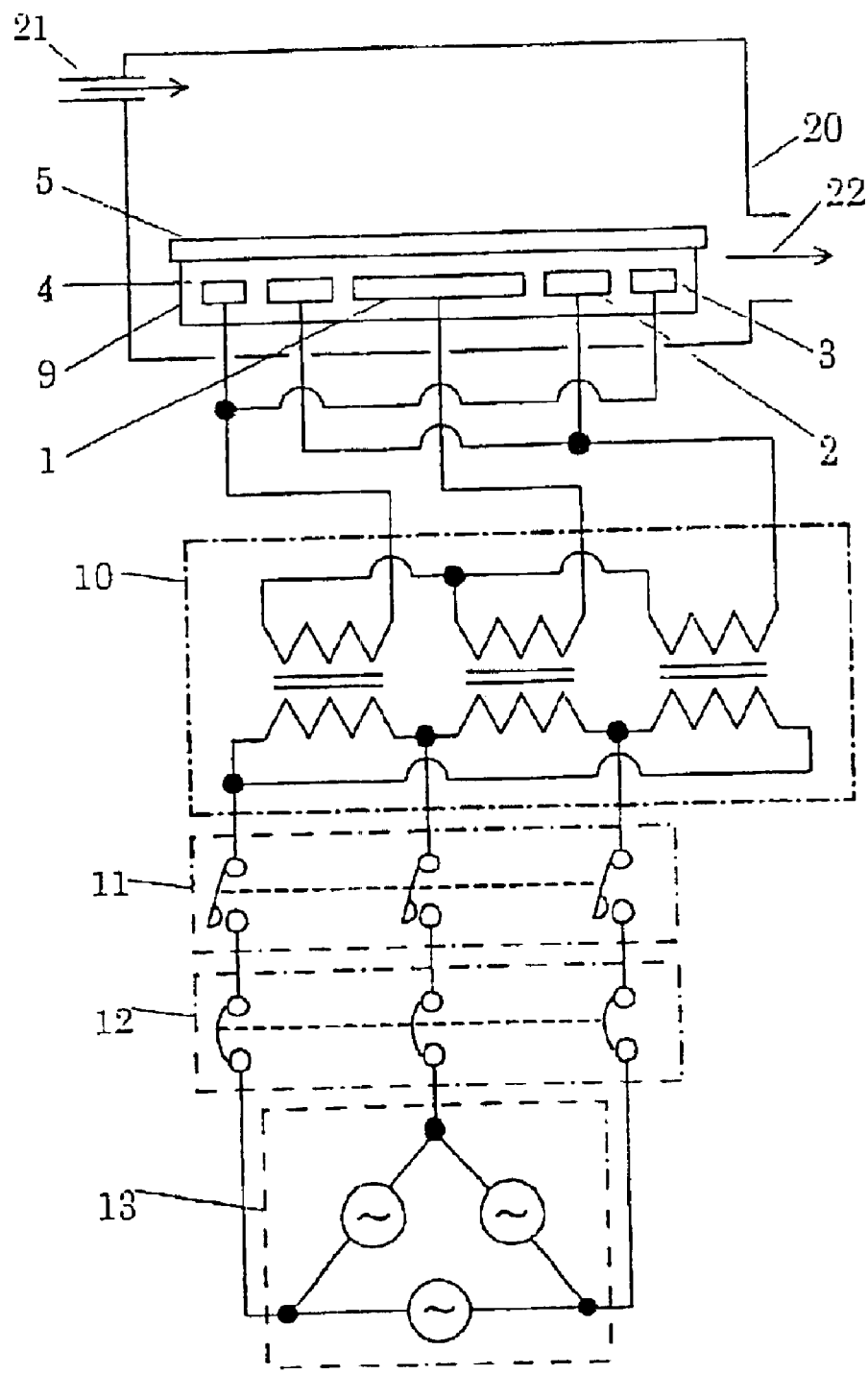
FIG. 12 illustrates another embodiment of a processing equipment for a substrate utilizing the electric chuck of the present invention.
Figure 14:
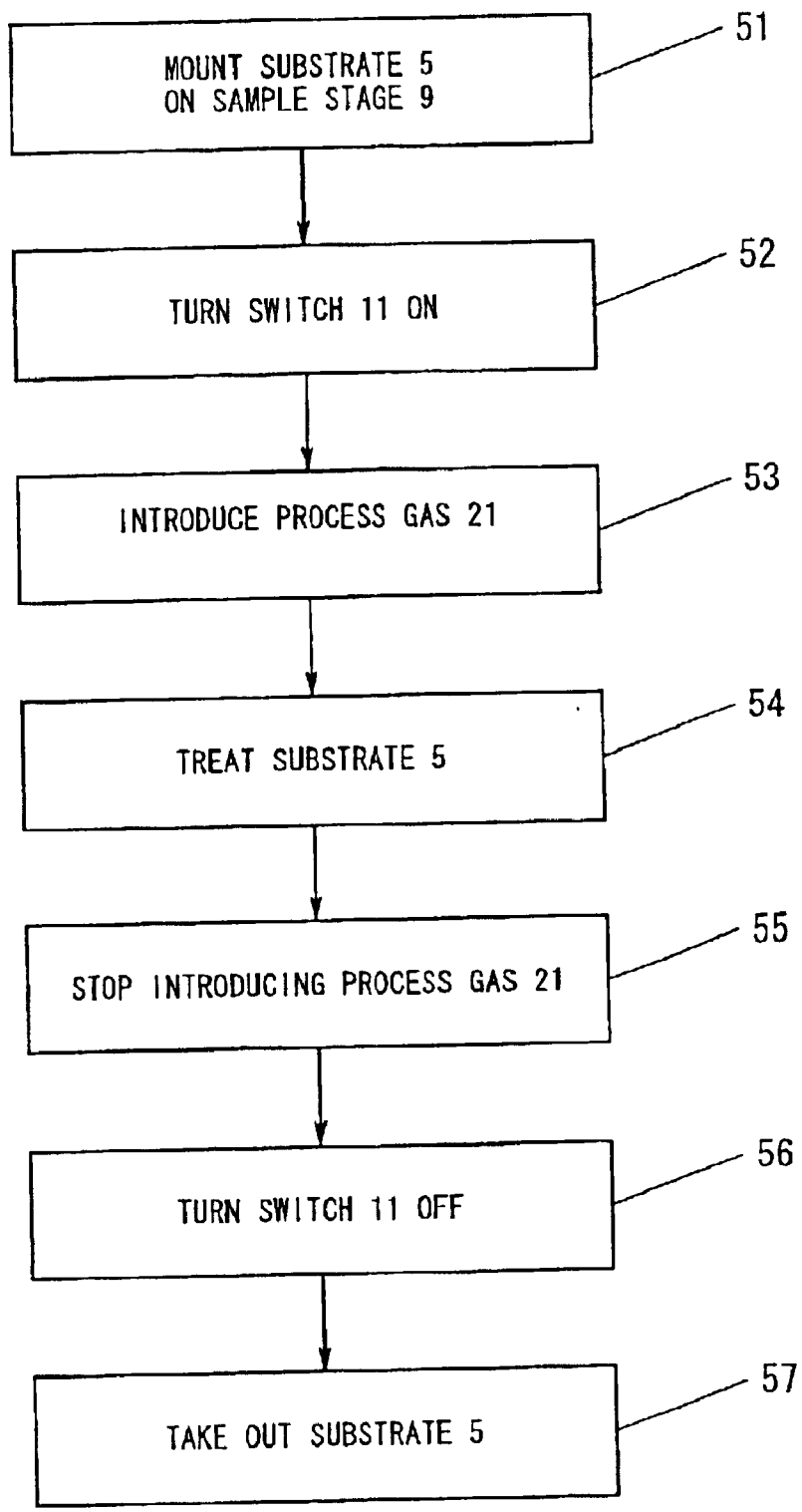
FIG. 14 is a flowchart showing another embodiment of the method for processing a substrate using the electric chuck according to the present invention.
Figure 15:
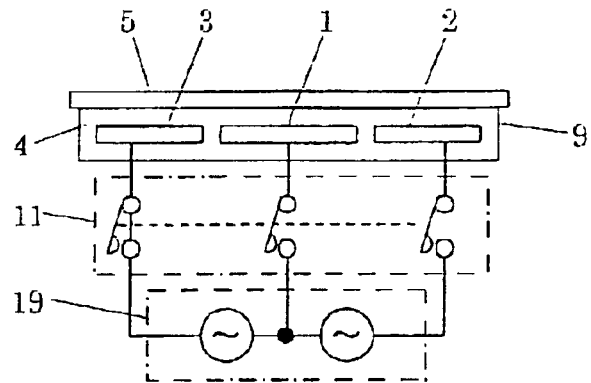
FIG. 15 illustrates the basic structure of the electrostatic chuck according to the present invention in which two-phase alternating voltage is applied (n=2)
Figure 16:
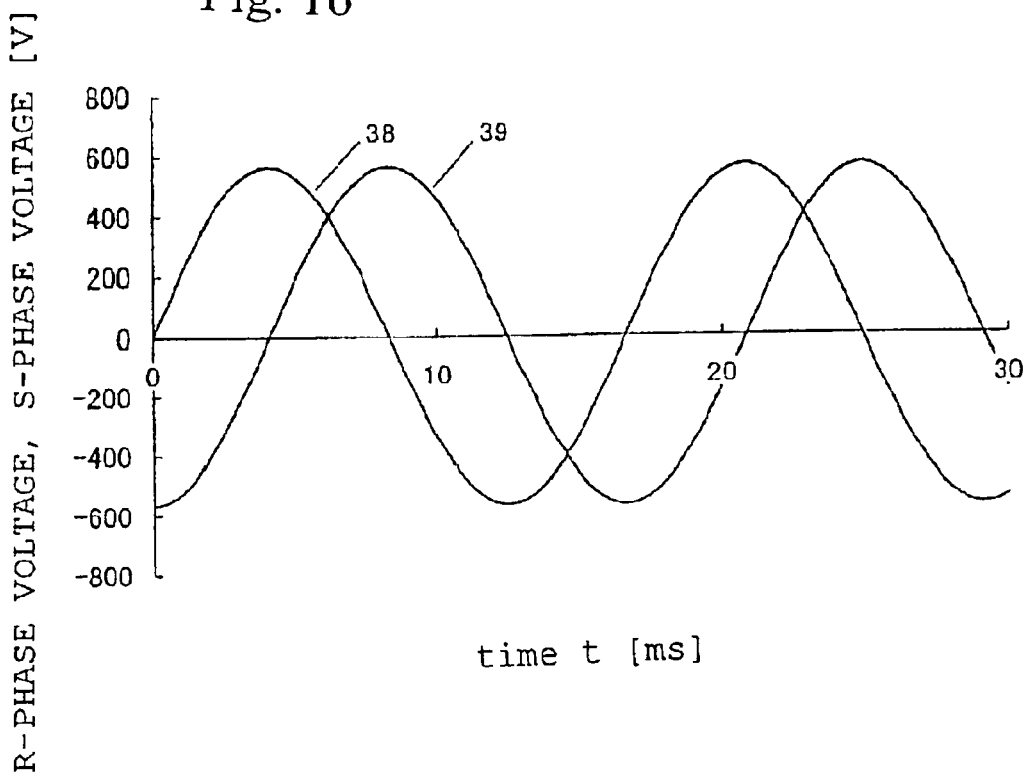
FIG. 16 illustrates the time variation of R-phase voltage and S-phase voltage of the two-phase alternator when applying two-phase alternating voltage to the electrostatic chuck of the present invention (n=2).

The electrostatic chuck according to the present invention can be applied to other substrate processing methods. FIGS. 12 and 14 illustrate another embodiment of a substrate processing method utilizing the electrostatic chuck of the present invention. FIG. 12 illustrates a substrate processing equipment according to the present invention. A sample stage 9 is disposed within a vacuum chamber 20, and a substrate 5 is mounted on the sample stage 9. Process gas 21 is introduced to the vacuum chamber. FIG. 14 is a flowchart showing the method of processing the substrate using the equipment illustrated in FIG. 12. In step 51, the substrate 5 is mounted on the sample stage 9, and thereafter in step 52, the substrate 5 is attracted to the sample stage 9. After the substrate 5 is treated in step 54, the procedure advances to step 56 where the substrate 5 is separated from the stage 9, and in step 57 the substrate 5 is taken out.

The electrostatic chuck according to the present invention is characterized in that an n-phase alternating voltage is applied to the equipment, wherein n is equal to or greater than 2. Unlike the conventional electrostatic chuck where direct voltage is applied, the present chuck is free from accumulated charges in the back surface of the wafer, and unlike the conventional chuck where single-phase alternating voltage is applied, the present equipment realizes an attraction force that does not fall to zero. Thus, the present invention provides an electrostatic chuck that does not require a charge elimination process, that realizes quick attraction and separation of the wafer and that eliminates wafer vibration.

What is claimed is:

1. An electrostatic chuck having alternating voltage applied thereto, wherein said alternating voltage is an n-phase alternating voltage where n is equal to or greater than 2, said electrostatic chuck comprising a sample stage including plural electrodes for applying said n-phase alternating voltage and an insulator for insulating a space between said electrodes, and a circuit for applying said n-phase alternating voltage, wherein said circuit for applying the n-phase alternating voltage insulates the primary side of the n-phase alternator from the secondary side thereof, and the secondary side supplying the n-phase alternating voltage to the electrodes is maintained at floating potential as opposed to ground potential.

2. An electrostatic chuck according to claim 1, wherein said electrodes for applying said n-phase alternating voltage are designed so that the electrodes corresponding to each phase have an area ratio of 1.

3. An electrostatic chuck according to claim 1, wherein said n-phase alternating voltage is set to n=3, utilizing a commercial three-phase alternator.

4. An electrostatic chuck according to claim 1, wherein said circuit for applying the n-phase alternating voltage is designed so that the voltage and the frequency being applied can be changed easily.

5. An electrostatic chuck according to claim 1, wherein said alternating voltage is an n-phase alternating voltage where n is equal to or greater than 2, said sample stage comprising plural electrodes for applying said n-phase alternating voltage and an insulator for insulating the space between said electrodes.

6. A substrate processing method for processing a substrate in a vacuum processing equipment equipped with an electrostatic chuck having alternating voltage applied thereto, said alternating voltage being an n-phase alternating voltage where n is equal to or greater than 2, said electrostatic chuck comprising a sample stage including plural electrodes for applying said n-phase alternating voltage and an insulator for insulating the space between said electrodes, and a circuit for applying said n-phase alternating voltage, wherein said substrate processing method comprises the steps of:

mounting a substrate on a sample stage installed in a vacuum chamber and holding said substrate to position by electrostatic attraction force;

introducing process gas into the vacuum chamber;

providing vacuum processing to the substrate by the introduced process gas;

stopping introduction of process gas after said vacuum processing;

turning the electrostatic attraction force off; and taking out the vacuum-processed substrate, wherein said circuit for applying the n-phase alternating voltage insulates the primary side of the n-phase alternator from the secondary side thereof, and the secondary side supplying the n-phase alternating voltage to the electrodes is maintained at floating potential as opposed to ground potential, and wherein said vacuum processing is a plasma treatment, characterized in that a charge elimination process of the substrate is not necessary when removing the substrate after the vacuum processing.

* * * * *